United States Patent
Langner (10) Patent No.: US 9,774,420 B1
(45) Date of Patent: Sep. 26, 2017

(54) REED-SOLOMON CODING FOR 40GBASE-T ETHERNET

(71) Applicant: Aquantia Corporation, Milpitas, CA (US)

(72) Inventor: Paul Langner, Fremont, CA (US)

(73) Assignee: Aquantia Corp., Milpitas, CA (US)

(*) Notice: Subject to any disclaimer, the term of this patent is extended or adjusted under 35 U.S.C. 154(b) by 78 days.

(21) Appl. No.: 14/995,141

(22) Filed: Jan. 13, 2016

Related U.S. Application Data (60) Provisional application No. 62/102,993, filed on Jan. 13, 2015.

(51) Int. Cl.
| | |
|---|---|
| *H03M 13/00* | (2006.01) |
| *H04L 1/00* | (2006.01) |
| *H04L 27/02* | (2006.01) |
| *H03M 13/11* | (2006.01) |
| *H03M 13/15* | (2006.01) |

(52) U.S. Cl.
CPC ....... *H04L 1/0041* (2013.01); *H03M 13/1102* (2013.01); *H03M 13/1515* (2013.01); *H04L 1/0045* (2013.01); *H04L 1/0057* (2013.01); *H04L 27/02* (2013.01)

(58) Field of Classification Search
CPC ... H04L 1/0041; H04L 1/0045; H04L 1/0057; H04L 27/02; H03M 13/1102; H03M 13/1515
See application file for complete search history.

(56) References Cited

U.S. PATENT DOCUMENTS

| | | |
|---|---|---|
| 5,680,400 A | 10/1997 | York |
| 6,052,385 A | 4/2000 | Kanerva |
| 6,081,523 A | 6/2000 | Merchant et al. |
| 6,111,890 A | 8/2000 | Rao |
| 6,195,360 B1 | 2/2001 | Raza et al. |
| 7,027,407 B2 | 4/2006 | Diepstraten et al. |
| 7,324,511 B2 | 1/2008 | Nishihara |
| 7,525,992 B1 | 4/2009 | Shachal |
| 7,567,620 B2 | 7/2009 | Rozental |
| 7,593,431 B1 | 9/2009 | Lo et al. |
| 7,693,240 B2 | 4/2010 | Mezer |
| 7,720,075 B2 | 5/2010 | Costo |
| 7,782,852 B2 | 8/2010 | Tellado et al. |
| 8,112,646 B2 | 2/2012 | Tsai |
| 8,201,005 B2 | 6/2012 | Wertheimer et al. |

(Continued)

OTHER PUBLICATIONS

Ken Christense et al., IEEE 802.3az The Road to Energy Efficient Ethernet, IEEE Communications Magazine, Nov. 2010, 7 Pages.

(Continued)

*Primary Examiner* — Esaw Abraham
(74) *Attorney, Agent, or Firm* — Lance Kreisman; Peninsula Patent Group (57) ABSTRACT

A BASE-T Ethernet transceiver is disclosed. The transceiver includes a BASE-T Ethernet transmit circuit that employs a data framing module. The data framing module includes an input interface to receive Ethernet block data bits, and logic to aggregate the Ethernet block data bits in accordance with a 512/513B code. A forward error correction encoder is coupled to the logic to encode at least a first portion of the data bits to generate first error check bits. A Reed-Solomon (RS) encoder is coupled to the logic to encode at least a second portion of the data bits in accordance with a Reed-Solomon error code to generate second error check bits.

20 Claims, 8 Drawing Sheets

(56) References Cited

U.S. PATENT DOCUMENTS

| | | |
|---|---|---|
| 8,218,612 B2 | 7/2012 | Chien |
| 8,243,752 B2 | 8/2012 | Barkan |
| 8,276,013 B2 | 9/2012 | Diab et al. |
| 8,320,411 B1 | 11/2012 | Sedarat et al. |
| 9,143,142 B2 | 9/2015 | Meagher |
| 2002/0006167 A1 | 1/2002 | McFarland |
| 2002/0119783 A1 | 8/2002 | Bourlas et al. |
| 2003/0016797 A1 | 1/2003 | Zakrzewski |
| 2003/0040298 A1 | 2/2003 | Heatley |
| 2004/0184810 A1 | 9/2004 | Spilman et al. |
| 2005/0018784 A1 | 1/2005 | Kurobe |
| 2005/0030808 A1 | 2/2005 | Brown et al. |
| 2005/0055467 A1 | 3/2005 | Campana et al. |
| 2005/0058152 A1 | 3/2005 | Oksanen et al. |
| 2005/0105545 A1 | 5/2005 | Thousand et al. |
| 2005/0152466 A1 | 7/2005 | Maltsev et al. |
| 2005/0259685 A1 | 11/2005 | Chang et al. |
| 2005/0286521 A1 | 12/2005 | Chiang |
| 2006/0109784 A1 | 5/2006 | Weller et al. |
| 2006/0153307 A1 | 7/2006 | Brown et al. |
| 2006/0215561 A1 | 9/2006 | Wang et al. |
| 2007/0192505 A1 | 8/2007 | Dalmia |
| 2007/0248024 A1 | 10/2007 | Conway et al. |
| 2008/0095188 A1 | 4/2008 | Remy |
| 2008/0151792 A1 | 6/2008 | Taich |
| 2008/0187028 A1 | 8/2008 | Lida |
| 2008/0294919 A1 | 11/2008 | Lida et al. |
| 2009/0080459 A1 | 3/2009 | Barkan |
| 2009/0150745 A1 | 6/2009 | Langner et al. |
| 2009/0282277 A1 | 11/2009 | Sedarat |
| 2010/0075704 A1 | 3/2010 | McHenry et al. |
| 2010/0115295 A1 | 5/2010 | Diab |
| 2010/0188980 A1 | 7/2010 | Desai et al. |
| 2010/0241923 A1 | 9/2010 | Wang et al. |
| 2011/0249687 A1 | 10/2011 | Diab et al. |
| 2012/0026922 A1 | 2/2012 | Diab |
| 2012/0063295 A1 | 3/2012 | Bliss |
| 2012/0106345 A1 | 5/2012 | Diab |
| 2012/0170591 A1 | 7/2012 | Diab et al. |
| 2012/0188894 A1 | 7/2012 | Huschke et al. |
| 2013/0070823 A1 | 3/2013 | Malkin et al. |
| 2014/0040704 A1 | 2/2014 | Wu et al. |
| 2015/0030337 A1 | 1/2015 | Mateosky |
| 2015/0067380 A1 | 3/2015 | Zhan et al. |

OTHER PUBLICATIONS

Hugh Barrass, EEE Exchange of Management Information, IEEE 802.3az EEE Task Force, Mar. 2009, Vancouver, British Columbia, 11 Pages.

Nariman Yousefi, Multi Rate PHY, IEEE Meeting Slides, Jul. 2003, 14 pages.

Zhang et al; IEEE Apr. 2010; pp. 843-855; "An Efficient 10GBASE-T Ethernet LDPC Decoder Design with Low Error Floors".

Mankar et al.; ACEEE, Proc of Intl. Conf. on Recent Trends in Information, Telecommunication and Computing, ITC; 5 pages; "Algorithms and Architectures for Reduced Complexity LDPC Decoding".

REED-SOLOMON CODING FOR 40GBASE-T ETHERNET

RELATED APPLICATIONS

This Application claims the benefit of priority under 35 U.S.C. 119(e) to Provisional Application No. 62/102,993, filed Jan. 13, 2015, entitled REED-SOLOMON CODING FOR 40GBASE-T ETHERNET, and is expressly incorporated by reference herein.

TECHNICAL FIELD

The disclosure herein relates generally to electronic communications, and more particularly to coding and decoding received data in electronic communications.

BACKGROUND

Transferring information between computers and other electronic devices can be implemented using any of a variety of different standards and technologies. Channel coding and error correction techniques can be used to reduce errors in received signals introduced from distortion and other disturbances. Such coding and error correction can be implemented using an encoder and a decoder at the ends of the transmission channel.

Figure 1:
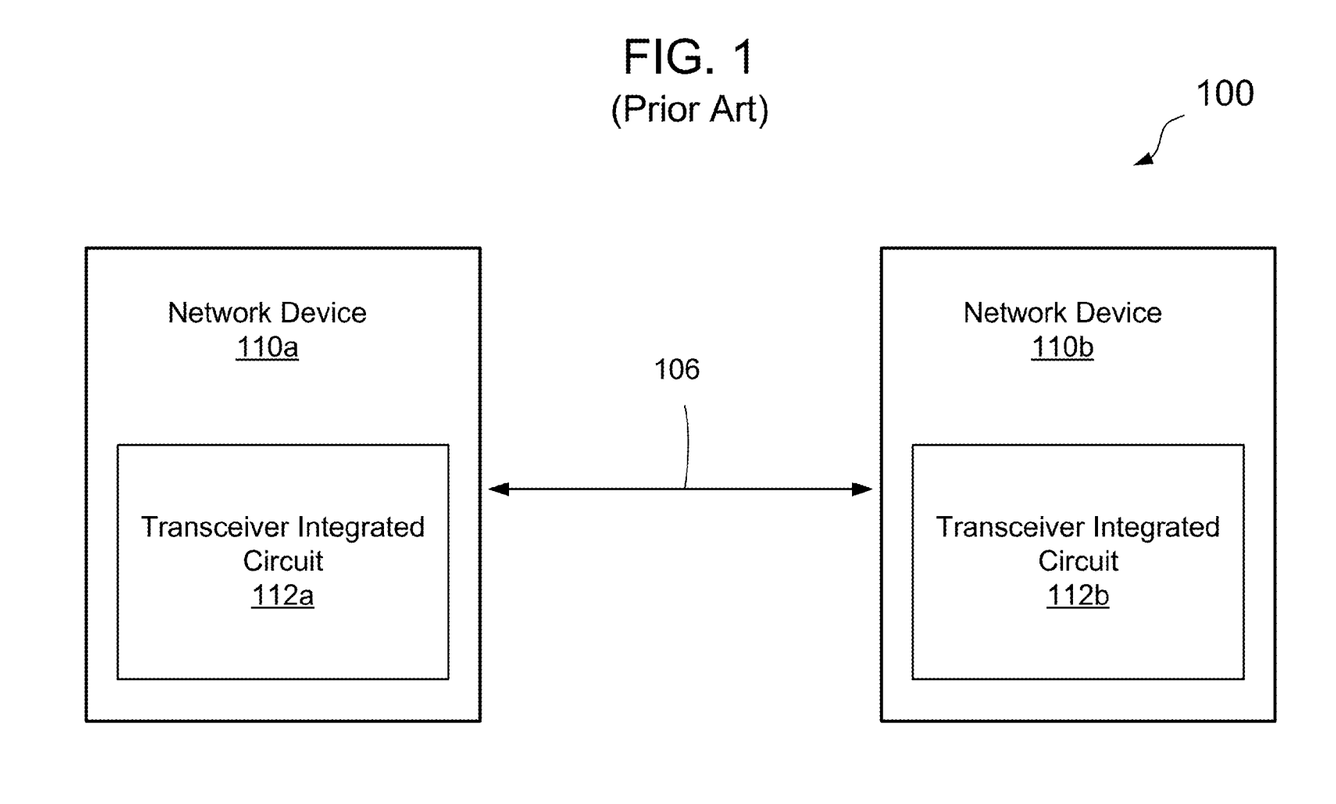
FIG. 1 illustrates a 10GBASE-T signaling link bounded by respective transceivers.

One increasingly popular communication standard is 10 Gigabit Ethernet, with a nominal data rate of 10 Gbit/s. 10GBASE-T is one such standard used to provide 10 gigabit per second connections over unshielded or shielded twisted pair cables. FIG. 1 illustrates a standard 10GBASE-T architecture, with respective first and second network devices 110a and 110b communicating via transceiver circuits 112a and 112b over a link 106. The wire-level modulation for 10GBASE-T is a Tomlinson-Harashima Precoded (THP) version of pulse-amplitude modulation with 16 discrete levels (PAM-16), encoded in a two-dimensional constellation pattern known as 128-DSQ (Double Square QAM).

Figure 2:
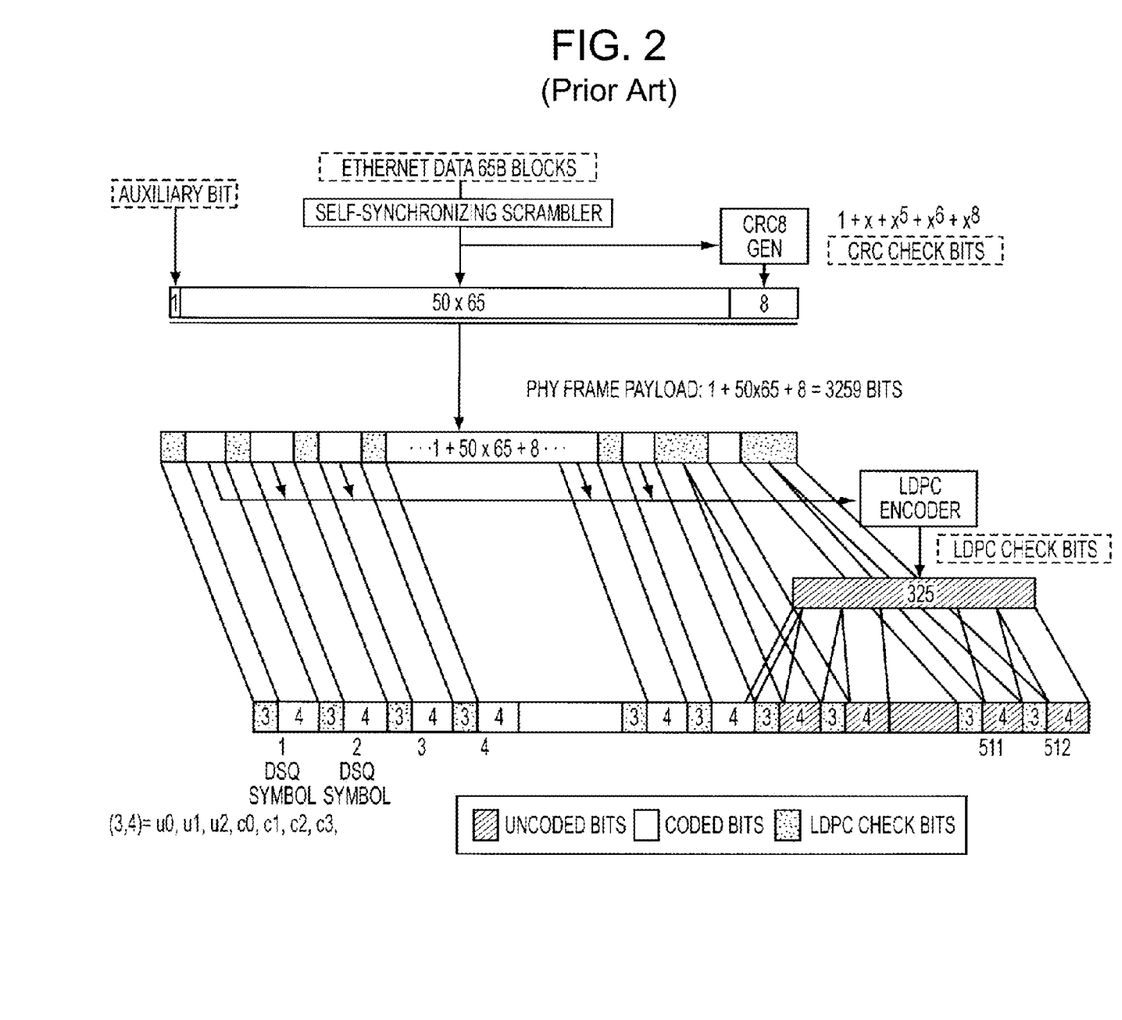
FIG. 2 illustrates a transmission frame for the 10GBASE-T communication standard.

As shown in FIG. 2, the 10GBASE-T transport frame is based on a (2048, 1723) Low Density Parity Check (LDPC) code, i.e. 2048 total bits with 1723 data bits and 325 check bits per frame, where the check bits are used to fix or detect errors in the frame. This is used in combination with the 128-DSQ synthetic constellation that uses a combination of coded and uncoded bits to transmit information. As shown, Ethernet data is retrieved in fifty 65-bit blocks and is scrambled, e.g. provided to a self-synchronizing scrambler to scramble the bits, and a CRC-8 generation of 8 check bits is provided on one end of the frame and an auxiliary channel bit on the other end, creating 3259 bits in the frame payload. The payload is then divided up into 1723 bits for the LDPC coder, and 1536 uncoded bits (3×512) that are not coded by the LDPC coder. The coded LDPC check bits (325 bits) are added to the end of the payload. The LDPC block size after coding is 2048 total bits (4×512).

Figure 3:
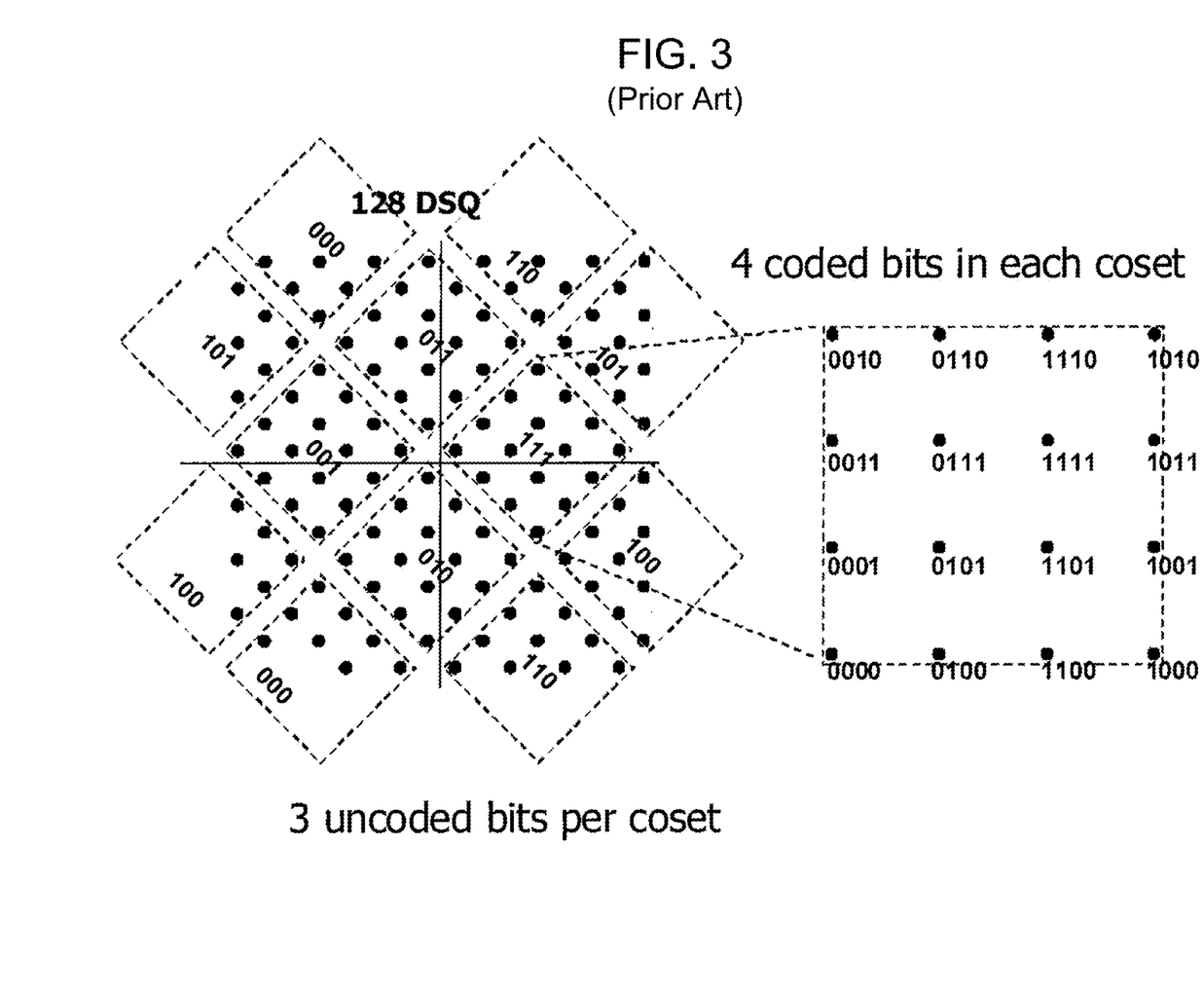
FIG. 3 illustrates a constellation for 128-DSQ modulation used in the standard of FIG. 2 and the labeling of points in a coset used with the constellation.

The resulting frame is mapped to 128-DSQ symbols, and the resulting DSQ symbols are then precoded using THP. Each of these 512 128-DSQ symbols are then transmitted as a pair of PAM-16 symbols (x-axis and y-axis), to create 1024 symbols (3584 bits). The constellation for 128-DSQ symbols is shown in FIG. 3, and consists of 8 cosets (regions), each coset containing 16 points. The coset label contains the 3 uncoded bits as shown in FIG. 3, and the points within the coset contain the 4 coded bits protected using the LDPC block code. The labeling of the points in the coset (the coset elements) conveying the 4 coded bits is also shown in FIG. 3.

The receiver unscrambles a received frame and decodes the coded bits. Any of several decoding algorithms for LDPC codes can be used in the receiver to decode the received coded bits. For example, iterative decoders are often used to converge on a correct decoded value. In one implementation, LDPC decoding is performed in the receiver using a soft-decision, message-passing algorithm. The bits are treated as continuous variables which represent the probability of the value being a 0 or a 1, and the continuous variables are represented in the decoding algorithm as Log Likelihood Ratios (LLRs). The message passing algorithm sets the variable nodes to the soft receive LLRs, calculates the syndrome LLRs given the variable LLRs, updates the variable LLRs with the new syndrome information, and iterates in this same way until a convergence is reached (e.g., check bits are zero). Using the 10GBASE-T transmission scheme, it is possible to have very low bit error rates that come very close to the Shannon limit of the communication channel.

While the transmission scheme described above works well for its intended applications, it would be desirable to utilize the 10GBASE-T frame structure for data rate transmissions greater than 10 Gbps, such as 40 Gbps.

DETAILED DESCRIPTION

Embodiments of methods of signaling along a high-speed Ethernet link are disclosed. In one embodiment, a BASE-T Ethernet transceiver is disclosed. The transceiver includes a BASE-T Ethernet transmit circuit that employs a data framing module. The data framing module includes an input interface to receive Ethernet block data bits, and logic to aggregate the Ethernet block data bits in accordance with a 512/513B code. A forward error correction encoder is coupled to the logic to encode at least a first portion of the data bits to generate first error check bits. A Reed-Solomon (RS) encoder is coupled to the logic to encode at least a second portion of the data bits in accordance with a Reed-Solomon error code to generate second error check bits.

The inventor has discovered that by re-organizing the various groups of bits in a given 10GBASE-T transport frame, employing Reed-Solomon check bits within the frame, and coding certain control bits, that data transmissions may be successfully carried out at data rates far surpassing 10 Gbps, such as up to 40 Gbps. As a result, the embodiments described herein are suitable for use in 40GBASE-T environments.

Current 40GBASE-T proposals reuse the 10GBASE-T frame. As described above, within the 10GBASE-T frame are various groups of bits including an auxiliary bit, eight CRC-8 error check bits, and fifty 65B frames, for a total of 3259 payload bits. Of these bits, 1723 of them are protected via LDPC coding, while 1536 (512×3) are uncoded for 10GBASE-T data rates. For 40GBASE-T data rates, up to 40 Gbps, the uncoded bits need to be protected by some form of error coding.

As an overview, Reed-Solomon error coding schemes are block-based error control codes, built using Galois field elements. Galois fields can be constructed from powers of prime numbers. $2^N$ is a very popular choice, which leads to a maximum block size of $2^N-1$ symbols. For example, $2^8$ gives a maximum block size of 255 bytes. The general format is M data symbols plus 2T check symbols.

For Reed-Solomon codes, the 2T check symbols can locate and correct T errored symbols, and detect the presence of 2T errored symbols. One way to look at this is that for each errored symbol, we need one symbol to locate the error within the block, and another symbol to contain the correction. The code is described as $RS2^N$ ("Total symbols", "Payload symbols"). For example, the code RS256(128, 120) would have 120 payload bytes in a frame with 8 check bytes capable of correcting 4 bytes in the frame. The optimal RS block size is usually chosen such that $2^N$ symbols are just slightly larger than the number of symbols you have to correct. This generally maximizes the number of correctable symbols within the block.

One proposal for a 40GBASE-T scheme based on the 10GBASE-T frame (described above) converts the fifty 65B blocks into two 65B blocks plus twelve 257B blocks, thus freeing up thirty-six bits Eliminating the eight CRC-8 check bits brings the total available number of bits to forty-four. The proposal goes on to recommend using an eleven-bit symbol to create a two-symbol correcting Reed-Solomon RS2048 code with the available bits. Thus, the 1536 bits map into 140 eleven-bit symbols with 4x zero bits, resulting in an RS2048 (144,140) code. While this may work for its intended applications, the symbol size is not optimal, as RS2048 can deal with a 2047×11-bit block—a very large block size.

As an alternative, working in a 2N-based field, one may employ an RS256 code that gives a maximum block size of 255×8=2040 bits, enough to cover the 1536 bits (192 bytes) that need protecting. However, in order to make RS256 effective, at least 48 bits (3×8-bit symbols) need to be freed from the 10GBASE-T frame (instead of only 44 bits, as proposed above).

Reorganizing the 10GBASE-T frame structure to free up at least 48 bits, in one embodiment, involves converting the fifty 65B blocks into two 65B blocks plus six 513B blocks to free up 42 bits. The 42 bits may then be combined with the eight CRC-8 check bits for a total of 50 free bits. This allows for using an 8-bit symbol to create a three-symbol correcting RS256 code in the frame structure. Thus, 1536 bits maps into 192 8-bit symbols with 2× zero bits, giving us an RS256(198, 192) code.

Figure 4:
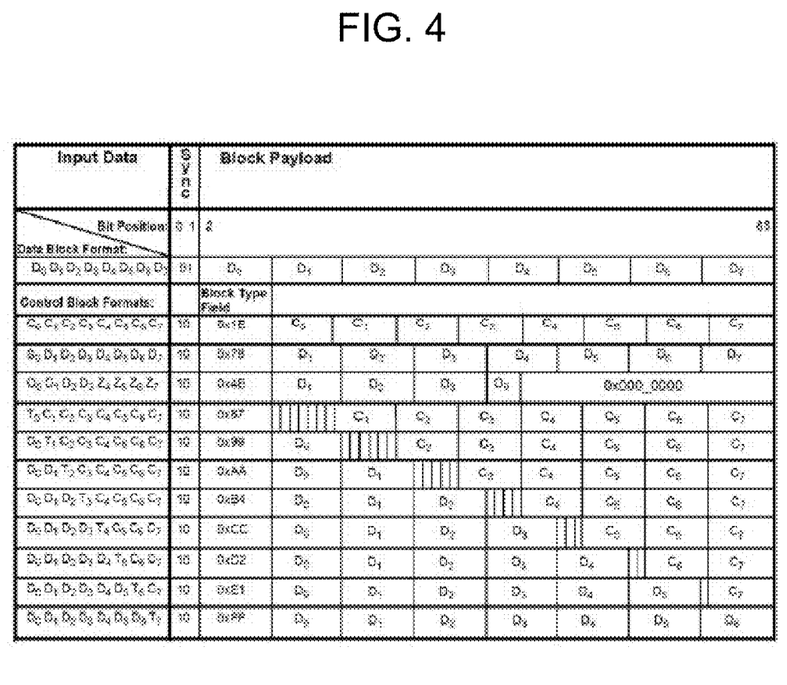
FIG. 4 illustrates a chart of the "block field types" proposed for one 40GBASE-R standard.

In order to successfully carry out the conversions above to 512/513B encoding, certain sub-coding steps are employed. 40GBASE-R employs a 64/66B PCS that uses eleven block field types to transport all of the "Start-of-Frame", "End-of-Frame", and ordered set information received from the XLGMII interface. FIG. 4 illustrates the various 64/66B block formats. Since each block field type is an 8-bit value, there are 256 possible block field types, of which only 11 are used. Four bits are thus sufficient to identify the 11 block field types, leaving 4 bits to encode all possible combinations of 64/66 block types in all combinations of 8 locations. This may be accomplished by employing a scheme proposed by Trowbridge, et. al.

Figure 5:
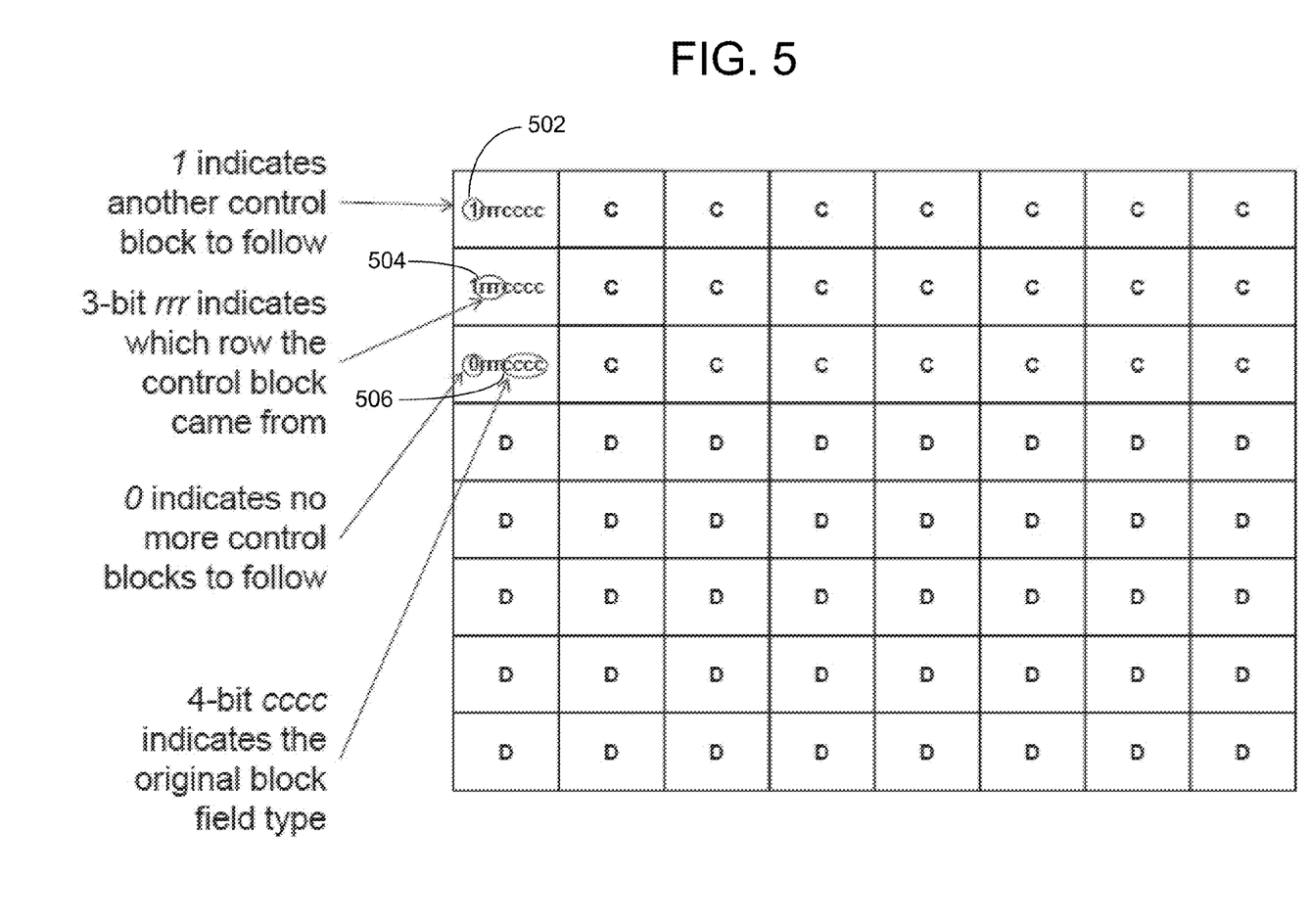
FIG. 5 illustrates a coding scheme associated with the block field types of FIG. 4 to enable 512/513B encoding.

FIG. 5 illustrates a matrix showing the Trowbridge scheme. For each set of eight bits in a given location (sixty-four locations shown), a control/data bit for the block indicates whether there are control frames present. If there are, they are all placed at the top of the block with the first bit being used to indicate whether there are more control blocks to follow, such as at 502, and the next three bits to indicate the row, such as at 504. The remaining four bits indicate the original block field type, such as at 506.

Figure 6:
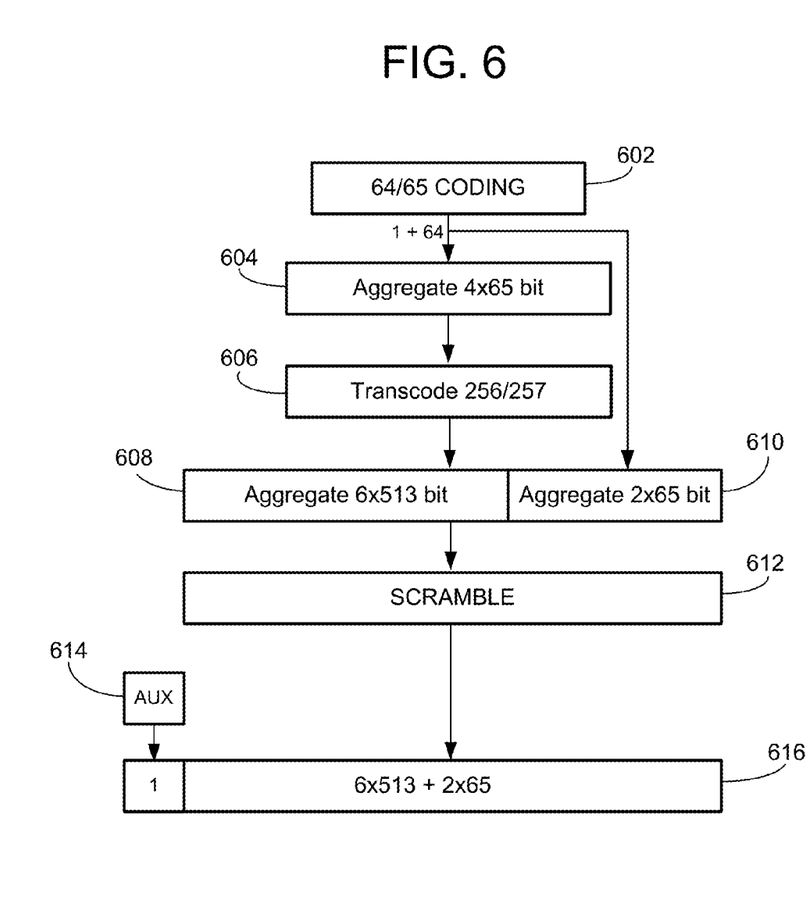
FIG. 6 illustrates initial steps involved in a mapping of a transmission frame in accordance with one embodiment.
Figure 7:
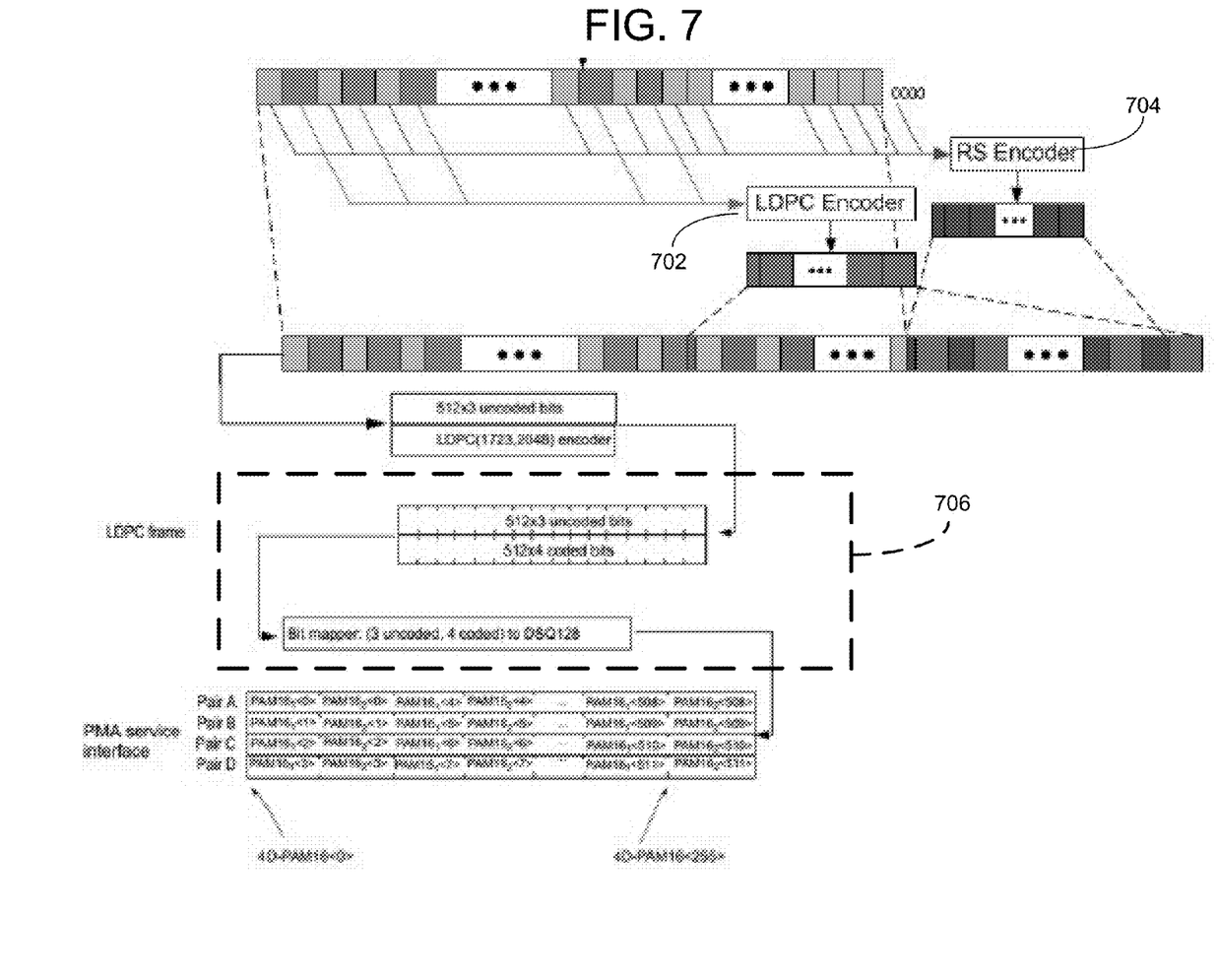
FIG. 7 illustrates further steps involved in a mapping of a transmission frame.

The resulting mapping is shown in FIGS. 6 and 7. Referring first to FIG. 6, a 40 Gigabit Media Independent Interface (XGMII) interfaces a media access controller (MAC) to a transceiver (PHY). The XGMII interface delivers data in a 64/65 block coding format, at 602. Forty-eight of the fifty block transfers of 65 bits are processed by 1) aggregating four blocks of 65 bits into a payload, at 604, and 2) transcoding the aggregated data into a 256/257 block, at 606. Note that the aggregated payload includes 325 bits set aside as the LDPC check bits, and 48 bits as Reed-Solomon check bits for the non-LDPC protected bits. The transcoding involves utilizing the Trowbridge scheme, such that six 513 bit blocks may be aggregated, at 608. As the six 513 bit blocks are aggregated, the last two of the 65 bit blocks are also aggregated, at 610, and combined with the six 513 bit blocks. The resulting combination of bits is then scrambled, at 612, and augmented with an auxiliary bit, at 614, to create the resulting frame, at 616.

FIG. 7 illustrates further framing steps for the frame created, at 616, in FIG. 6. An LDPC encoder, at 702, encodes the 1723 bits that are to be LDPC protected (4 bits per 8-bit symbol), while a Reed-Solomon encoder, at 704, generates the RS code for the remaining 1536 bits (3 bits per 8-bit symbol). The resulting transport frame is mapped into plural symbols by a symbol mapper 706. For one specific embodiment, the symbols are in the form of back-to-back PAM-16 symbols, each symbol having a total of 7 bits (4 coded via LDPC, 3 uncoded), creating a 128DSQ constellation. The "uncoded" bits that are associated with the constellation are nevertheless protected by the Reed-Solomon check bits provided in the transport frame.

The symbols are then transmitted at a desired symbol rate by a transmitter across plural twisted pair copper channels "Pair A", "Pair B", "Pair C" and "Pair D." The transmit symbol rate for one embodiment may be matched to the expected rated bandwidth (half the symbol rate) of the physical channels provided by the cable. Other data rates may be utilized by varying the symbol rate and/or the symbol mapping scheme.

Figure 8:
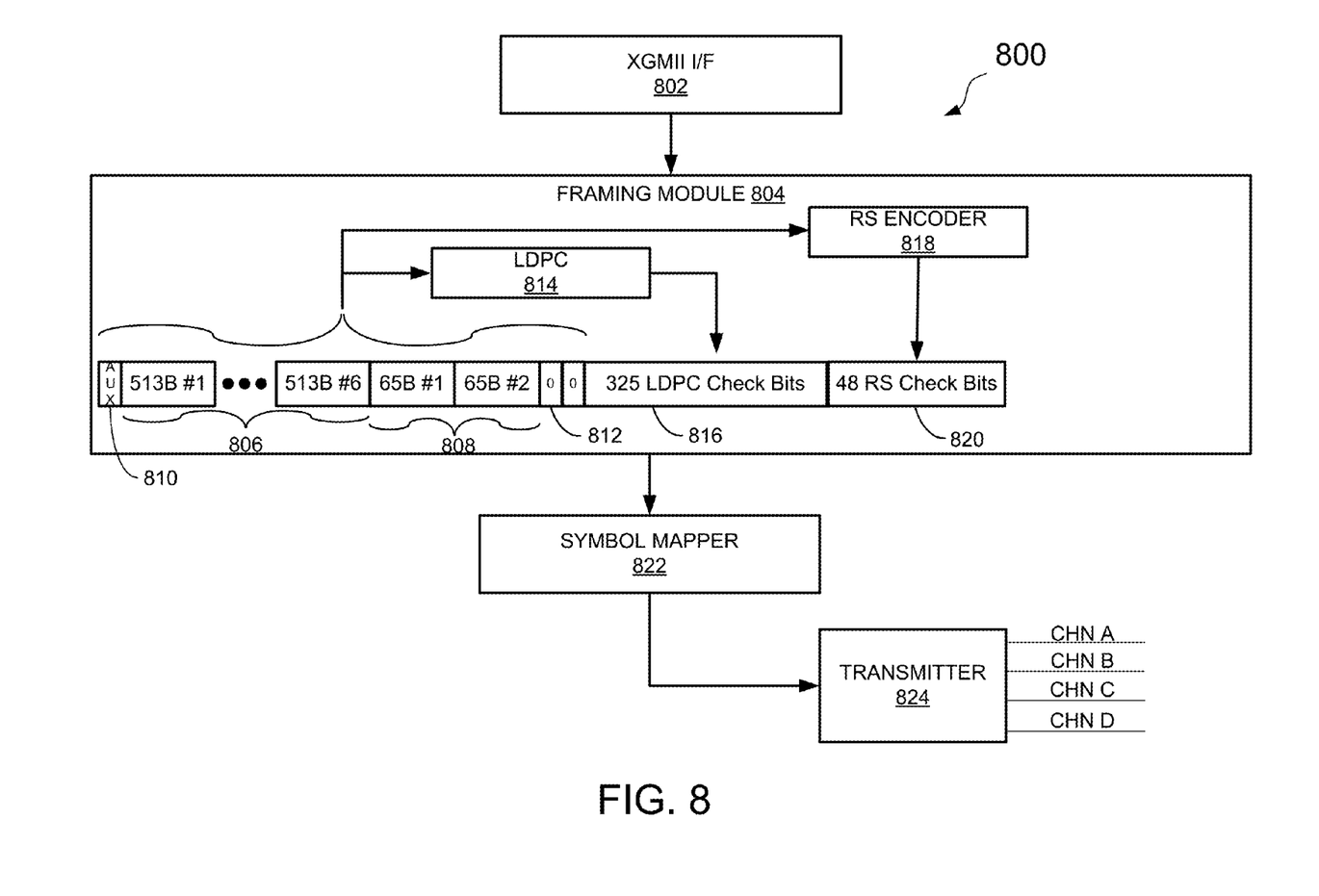
FIG. 8 illustrates a block diagram of a BASE-T transceiver that employs a framing module to carry out Ethernet data bit allocations, LDPC framing, and Reed-Solomon encoding in accordance with the mappings of FIGS. 6 and 7.

FIG. 8 illustrates one embodiment of a BASE-T transceiver, generally designated 800, that employs a framing module 804 to generate a unique transport frame consistent with the transport frame described above for Ethernet data transmissions up to and including 40 Gbps. Further referring to FIG. 8, the transceiver 800 includes a 40 Gigabit Media Independent Interface (XGMII) 802 that interfaces the transceiver 800 to a media access controller (MAC), not shown. The XGMII interface 802 then feeds the data to the framing module 804. The framing module, consistent with the description above with respect to FIG. 7, aggregates a certain amount of the data as a payload, for example, six 513B frames, at 806, together with two 65B frames, at 808, an auxiliary bit, at 810, and two "zero bits", at 812. For each 8-bit symbol, 4 of the bits are passed to an LDPC encoder 814 to generate 325 LDPC check bits, at 816. Three bits from each 8-bit symbol are passed to a Reed-Solomon encoder 818 to generate 48 Reed-Solomon check bits, at 820. For one specific embodiment, the Reed-Solomon check bits are in accordance with a Reed-Solomon code such as RS256 (198, 192), which includes forty-eight (48) check bits that are capable of correcting, for example, 3 data payload bytes in the frame.

With continued reference to FIG. 8, each transport frame generated by the framing module 804 is mapped into plural symbols by a symbol mapper 822. For one specific embodiment, the symbols are in the form of back-to-back PAM-16 symbols, each symbol having a total of 7 bits (4 coded via LDPC, 3 uncoded), creating a 128DSQ constellation. The uncoded bits that are associated with the 128DSQ constellation are nevertheless protected by the Reed-Solomon check bits provided in the transport frame.

The symbols are then transmitted at a desired symbol rate by a transmitter 824 across plural physical channels CHN A, CHN B, CHN C and CHN D. The transmit symbol rate for one embodiment may be matched to the expected rated bandwidth (half the symbol rate) of the physical channels provided by the cable. Other data rates may be utilized by varying the symbol rate and/or the symbol mapping scheme.

At the receive side of the channel, an inverse process is carried out by a receiver link partner to retrieve the data and to decode the contents. The Reed-Solomon coding described above enables for corrections to up to three 8-bit symbols at data rates up to 40 Gbps, while still utilizing the transport frame corresponding to the 10GBASE-T standard.

Those having skill in the art will appreciate the many benefits and advantages afforded by the embodiments presented herein. Of significant benefit is the ability to reuse 10GBASE-T transport frame structures for data rates far surpassing 10 Gbps. Further, by incorporating Trowbridge coding, 512/513B coding may be employed, which allows for an optimal RS error coding solution.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., ' ') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A BASE-T Ethernet transceiver comprising:
   a BASE-T Ethernet transmit circuit including
      a BASE-T Ethernet data framing module including
         an input interface to receive Ethernet block data bits,
         logic to aggregate the Ethernet block data bits in accordance with a 512/513B code,
         a forward error correction encoder coupled to the logic to encode at least a first portion of the data bits to generate first error check bits, and
         a Reed-Solomon (RS) encoder coupled to the logic to encode at least a second portion of the data bits in accordance with a Reed-Solomon error code to generate second error check bits.

2. The BASE-T Ethernet transceiver of claim 1, wherein the Reed-Solomon error code comprises an RS256 (198, 192) error code.

3. The BASE-T Ethernet transceiver of claim 2, wherein the logic associates the Ethernet block data bits with an auxiliary bit, the first error check bits, and the Reed-Solomon check bit.

4. The BASE-T Ethernet transceiver of claim 1, wherein the forward error correction encoder comprises a Low Density Parity Check (LDPC) encoder.

5. The BASE-T Ethernet transceiver of claim 1, further comprising:
 a symbol mapper to receive the first error encoded transport frame and to modulate the first error encoded transport frame into symbols, each of the symbols having uncoded bits; and
 a BASE-T transmitter coupled to the symbol mapper to transmit the first group of symbols over an Ethernet link at a given symbol rate; and
 wherein errors in the uncoded bits for a predetermined number of the symbols are correctable via the Reed-Solomon check bits.

6. The BASE-T Ethernet transceiver of claim 5, wherein the predetermined number of symbols that are correctable comprises three.

7. The BASE-T Ethernet transceiver of claim 5, wherein the symbol mapper includes a PAM-16 encoder.

8. The BASE-T Ethernet transceiver of claim 7, wherein the symbol mapper transforms the transport frame into back-to-back PAM-16 modulated symbols.

9. The BASE-T Ethernet transceiver of claim 5, wherein the symbol mapper generates 512 symbols for the transport frame.

10. The BASE-T Ethernet transceiver of claim 5, wherein the symbol mapper modulates the transport frame in accordance with a 128DSQ modulation.

11. A method of transferring Ethernet data, the method comprising:
 framing BASE-T Ethernet data including
  receiving Ethernet block data bits,
  aggregating the Ethernet block data bits in accordance with a 512/513B code,
  encoding at least a first portion of the data bits with a forward error correction encoder to generate first error check bits, and
  encoding at least a second portion of the data bits with a Reed-Solomon (RS) encoder to generate second error check bits.

12. The method of claim 11, wherein encoding at least a second portion of the data bits with an RS encoder is carried out in accordance with an RS256 (198, 192) error code.

13. The method of claim 11, further comprising:
 mapping the error encoded transport frame into symbols, each of the symbols having uncoded bits;
 transmitting the symbols as first Ethernet data over a BASE-T Ethernet link at a given symbol rate; and
 correcting errors in the uncoded bits for a predetermined number of the symbols via the Reed-Solomon check bits.

14. The method of claim 11, wherein the encoding at least a first portion of the data bits is carried out with a Low Density Parity Check (LDPC) encoder.

15. The method of claim 13, wherein the mapping further comprises modulating the transport frame in accordance with a 128DSQ modulation.

16. The method of claim 13, wherein the mapping comprises encoding the data transport frame into plural PAM-16 symbols.

17. The method of claim 16, wherein the plural PAM-16 symbols comprises plural back-to-back PAM-16 symbols.

18. The method of claim 16, wherein the plural PAM-16 symbols comprises 512 symbols.

19. A BASE-T Ethernet data framing module comprising:
 an input interface to receive Ethernet block data bits;
 logic to aggregate the Ethernet block data bits in accordance with a 512/513B code,
 a forward error correction encoder coupled to the logic to encode at least a first portion of the data bits to generate first error check bits, and
 a Reed-Solomon (RS) encoder coupled to the logic to encode at least a second portion of the data bits in accordance with a Reed-Solomon error code to generate second error check bits.

20. The BASE-T Ethernet data framing module of claim 19, wherein:
 the Reed-Solomon error code comprises an RS256 (198, 192) error code; and
 the 512/513B code includes control information sub-coded via a Trowbridge code.

* * * * *